(12) United States Patent
Kim et al.

(10) Patent No.: US 11,640,950 B2
(45) Date of Patent: May 2, 2023

(54) SEMICONDUCTOR CHIP AND SEMICONDUCTOR PACKAGE

(71) Applicant: SAMSUNG ELECTRONICS CO., LTD., Suwon-si (KR)

(72) Inventors: Byungwook Kim, Suwon-si (KR); Ahram Kang, Yongin-si (KR); Seongwon Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 17/210,695

(22) Filed: Mar. 24, 2021

(65) Prior Publication Data

US 2022/0077095 A1 Mar. 10, 2022

(30) Foreign Application Priority Data

Sep. 9, 2020 (KR) .................. 10-2020-0115328

(51) Int. Cl.
*H01L 23/00* (2006.01)
*H01L 23/538* (2006.01)

(52) U.S. Cl.
CPC .......... *H01L 24/14* (2013.01); *H01L 23/5384* (2013.01); *H01L 23/5386* (2013.01); *H01L 23/562* (2013.01)

(58) Field of Classification Search
CPC . H01L 24/14; H01L 23/5384; H01L 23/5386; H01L 21/76822; H01L 21/76885; H01L 21/76829; H01L 23/53295; H01L 23/3128; H01L 2224/0401
See application file for complete search history.

(56) References Cited

U.S. PATENT DOCUMENTS

| | | | |
|---|---|---|---|
| 6,184,143 B1 * | 2/2001 | Ohashi | H01L 21/7684 438/692 |
| 6,797,605 B2 | 9/2004 | Goh et al. | |
| 6,861,756 B2 * | 3/2005 | Saito | H01L 21/76852 257/E23.152 |
| 7,825,495 B2 | 11/2010 | Ryu et al. | |
| 8,198,133 B2 | 6/2012 | Daubenspeck et al. | |
| 9,209,148 B2 * | 12/2015 | Chan | H01Q 23/00 |
| 9,412,866 B2 | 8/2016 | Kuoh et al. | |
| 9,721,883 B1 * | 8/2017 | Lai | H01L 21/187 |

(Continued)

FOREIGN PATENT DOCUMENTS

| | | |
|---|---|---|
| JP | 20050303186 A | 10/2005 |
| JP | 6073943 A | 7/2015 |
| JP | 20180182223 A | 11/2018 |

*Primary Examiner* — Bac H Au
(74) *Attorney, Agent, or Firm* — Volentine, Whitt & Francos, PLLC

(57) ABSTRACT

A semiconductor chip includes; an intermetal dielectric (IMD) layer on a substrate, an uppermost insulation layer on the IMD layer, the uppermost insulation layer having a dielectric constant different from a dielectric constant of the IMD layer, a metal wiring in the IMD layer, the metal wiring including a via contact and a metal pattern, a metal pad in the uppermost insulation layer, the metal pad being electrically connected to the metal wiring, and a bump pad on the metal pad. An interface portion between the IMD layer and the uppermost insulation layer is disposed at a height of a portion between an upper surface and a lower surface of an uppermost metal pattern in the IMD layer.

20 Claims, 19 Drawing Sheets

(56) References Cited

U.S. PATENT DOCUMENTS

| | | | |
|---|---|---|---|
| 2003/0045088 A1* | 3/2003 | Imai | H01L 21/76838 |
| | | | 257/E21.582 |
| 2007/0187828 A1* | 8/2007 | Farooq | H01L 23/53295 |
| | | | 257/E21.576 |
| 2008/0185724 A1* | 8/2008 | Tseng | H01L 24/02 |
| | | | 257/762 |
| 2009/0017565 A1* | 1/2009 | Hasebe | G01R 31/2889 |
| | | | 257/E23.021 |
| 2009/0102059 A1* | 4/2009 | Ishii | H01L 23/5226 |
| | | | 257/E23.145 |
| 2010/0224966 A1* | 9/2010 | Chen | H01L 23/562 |
| | | | 257/737 |
| 2012/0193787 A1* | 8/2012 | Maitani | H01L 24/03 |
| | | | 257/737 |
| 2012/0211269 A1 | 8/2012 | Saitou et al. | |
| 2012/0235278 A1* | 9/2012 | Shigihara | H01L 24/03 |
| | | | 257/532 |
| 2013/0062777 A1* | 3/2013 | Ogata | H01L 24/05 |
| | | | 257/774 |
| 2014/0021614 A1* | 1/2014 | Yu | H01L 23/53238 |
| | | | 438/653 |
| 2014/0021622 A1* | 1/2014 | Bonilla | H01L 23/522 |
| | | | 257/773 |
| 2017/0005054 A1* | 1/2017 | Chiu | H01L 24/11 |
| | | | 257/E23.145 |
| 2017/0373019 A1 | 12/2017 | Rabie | |
| 2018/0308795 A1 | 10/2018 | Uchida et al. | |
| 2018/0315723 A1* | 11/2018 | Singh | G06F 30/398 |
| 2020/0168574 A1* | 5/2020 | Huang | H01L 24/16 |
| 2021/0035903 A1* | 2/2021 | Wu | H01L 24/05 |
| 2022/0181256 A1* | 6/2022 | Gomes | H01L 21/76898 |

\* cited by examiner

SEMICONDUCTOR CHIP AND SEMICONDUCTOR PACKAGE

CROSS-REFERENCE TO RELATED APPLICATION

This application claims priority under 35 USC § 119 to Korean Patent Application No. 10-2020-0115328 filed on Sep. 9, 2020 in the Korean Intellectual Property Office (KIPO), the subject matter of which is hereby incorporated by reference.

BACKGROUND

1. Field

Embodiments of the inventive concept relate generally to semiconductor chips and semiconductor packages including semiconductor chip(s).

2. Description of the Related Art

A semiconductor package may include a semiconductor chip disposed on a package substrate using conductive bumps. Due to differences in coefficients of thermal expansion associated with the semiconductor chip and the package substrate, thermal stress may arise at various points with the semiconductor package, such as contact points of the conductive bump(s), the so-called "back end of the line" area (hereafter, BEOL), etc. For example, thermal stress may cause chip-package-interaction (CPT) defects, such as delamination and/or cracking of intermetal dielectric (IMD) layers in the BEOL.

SUMMARY

Embodiments of the inventive concept provide semiconductor chips less susceptible to CPI defects potentially caused by thermal stress. Embodiments of the inventive concept also provide semiconductor packages exhibiting a reduced number of CPT defects.

According to embodiments, there is provided a semiconductor chip including; an intermetal dielectric (IMD) layer on a substrate, an uppermost insulation layer on the IMD layer, the uppermost insulation layer having a dielectric constant different from a dielectric constant of the IMD layer, a metal wiring in the IMD layer, the metal wiring including a via contact and a metal pattern, a metal pad in the uppermost insulation layer, the metal pad being electrically connected to the metal wiring, and a bump pad on the metal pad, wherein an interface portion between the IMD layer and the uppermost insulation layer is disposed at a height of a portion between an upper surface and a lower surface of an uppermost metal pattern in the IMD layer.

According to embodiments, there is provided a semiconductor chip including; a first intermetal dielectric (IMD) layer on a substrate, the first IMD layer having a first dielectric constant, a second IMD layer on the first IMD layer, the second IMD layer having a second dielectric constant different from the first dielectric constant, a third IMD layer on the second IMD layer, the third IMD layer having a third dielectric constant different from the second dielectric constant, an uppermost insulation layer on the third IMD layer, the uppermost insulation layer having a fourth dielectric constant different from the third dielectric constant, a first metal wiring in the first IMD layer, the first metal wiring including a first via contact and a first metal pattern, a second metal wiring in the second IMD layer, the second metal wiring including a second via contact and a second metal pattern, a third metal wiring in the third IMD layer, the third metal wiring including a third via contact and a third metal pattern, a metal pad in the uppermost insulation layer, the metal pad being electrically connected to the third metal wiring, and a bump pad for forming a conductive bump on the metal pad, wherein in a first region of the substrate, an upper surface of the third metal pattern disposed at an uppermost portion is exposed through an upper surface of the third IMD layer.

According to embodiments, there is provided a semiconductor package including; a package substrate, a semiconductor chip, and conductive bumps interposed between the package substrate and the semiconductor chip and electrically connecting the semiconductor chip and the package substrate. The semiconductor chip includes; an intermetal dielectric (IMD) layer on a substrate, an uppermost insulation layer contacting an upper surface of the IMD layer, the uppermost insulation layer having a dielectric constant different from a dielectric constant of the IMD layer, a metal wiring in the IMD layer, the metal wiring including a via contact and a metal pattern, a metal pad in the uppermost insulation layer, the metal pad being electrically connected to the metal wiring, and a bump pad on the metal pad, wherein in a first region of the substrate, an interface portion between the IMD layer and the uppermost insulation layer is disposed at a height of a portion between an upper surface and a lower surface of an uppermost metal pattern in the IMD layer.

BRIEF DESCRIPTION OF THE DRAWINGS

Embodiments will be more clearly understood from the following detailed description taken in conjunction with the accompanying drawings.

FIG. 1 is a cross-sectional view illustrating a semiconductor package according to embodiments of the inventive concept;

FIG. 2 is a cross-sectional view illustrating portions of a semiconductor chip and a conductive bump according to embodiments of the inventive concept:

FIG. 3 is an enlarged view of portion 'A' shown in FIG. 2;

FIG. 4 is a cross-sectional view illustrating portions of a semiconductor chip and a conductive bump according to embodiments of the inventive concept;

FIGS. 5 and 6 are a plan view and a cross-sectional view illustrating portions of a semiconductor chip and a conductive bump according to embodiments of the inventive concept;

FIGS. 7 and 8 are a plan view and a cross-sectional view illustrating portions of a semiconductor chip and a conductive bump according to embodiments of the inventive concept;

FIG. 9 is a cross-sectional view illustrating portions of a semiconductor chip and a conductive bump according to embodiments of the inventive concept;

FIGS. 10, 11, 12, 13, 14, 15 and 16 (hereafter, "FIGS. 10 to 16") are related cross-sectional views illustrating in one example a method for manufacturing a semiconductor chip and a conductive bump according to embodiments of the inventive concept;

FIG. 17 is a cross-sectional view illustrating portions of a semiconductor chip and a conductive bump according to embodiments of the inventive concept;

FIG. 18 is a cross-sectional view illustrating portions of a semiconductor chip and a conductive bump according to embodiments of the inventive concept; and FIG. 19 is an enlarged view of portion 'B' shown in FIG. 18.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther, thicker/thinner; proximate/distant; above/below; under/over; upper/lower; center/side; surrounding; overlay/underlay; etc.

Figure 1:
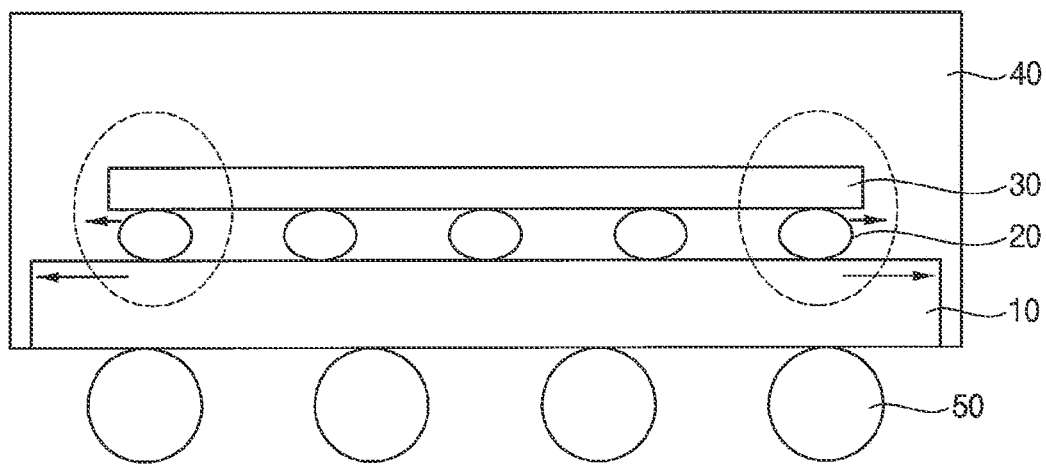
FIGS. 1 to 19 represent non-limiting, embodiments as described herein.

FIG. 1 is a cross-sectional view illustrating a semiconductor package 60 according to embodiments of the inventive concept.

Referring to FIG. 1, the semiconductor package 60 may include a package substrate 10, a semiconductor chip 30, conductive bumps 20, an epoxy molding compound 40, and solder balls 50.

The semiconductor chip 30 (e.g., a memory device or a logic device) may be disposed on an upper surface of the package substrate 10. Here, the semiconductor device 30 may include a front end of line (FEOL) including various circuits disposed on a silicon substrate, and a back end of line (BEOL) including conductive patterns (e.g., metal wirings) disposed on the FEOL.

The BEOL may include single layer or multiple layer metal wirings formed from one or more conductive materials (e.g., metal(s), such as copper, aluminum, etc.). In some embodiments, the metal wirings may be formed in an intermetal dielectric (IMD) layer. The IMD layer may include silicon oxide-based materials having a low dielectric constant (low-k). In some embodiments, the IMD layer may include stacked insulation material layers having different dielectric constants.

The conductive bumps 20 may be interposed between the semiconductor chip 30 and the package substrate 10 in such a manner to bond (electrically connect and mechanically mount) the semiconductor chip 30 and the package substrate 10. For example, each of the conductive bumps 20 may be interposed between a bump pad disposed on the semiconductor chip 30 and an upper pad disposed on the package substrate 10, such that the bump pad and the upper pad are electrically connected.

The epoxy molding compound 40 may cover the bonded combination of the semiconductor chip 30 and the package substrate 10. The solder balls 50 may be disposed on a lower surface of the package substrate 10, such that electrical signal(s) may be communicated (e.g., input to and/or output from) the package substrate 10 via the solder balls 50.

Within this configuration, the package substrate 10 may have a coefficient of thermal expansion (hereafter, CTE) greater than a CTE of the semiconductor chip 30. As a result, during operation of the semiconductor package 60, the package substrate 10 may materially expand under the influence of thermal stress more than the semiconductor chip 30. Due to this expansion difference between the semiconductor chip 30 and the package substrate 10, mechanical stress may be induced between (e.g.,) at one or more of the conductive bumps 20 and the BEOL of the semiconductor chip 30. This mechanical stress may cause chip-package-interaction (CPI) defects, such as delamination and/or cracking of various layers in the BEOL. Additionally or alternately, a high level of structure stress may be generated at an edge of the semiconductor chip 30.

In some circumstances, stress due to variable rates of thermal expansion between the semiconductor chip 30 and the package substrate 10 may be applied to inner portion(s) of the semiconductor chip 30 through one or more of the conductive bumps 20, and high levels of stress may be concentrated around one or more of the conductive bumps 20. Additionally, high levels of stress may be generated at surfaces of the metal wiring in the BEOL adjacent to the conductive bumps 20, as well as an interface portion between the IMD layers in the BEOL. As a result of one or more of these thermally-induced stress conditions, defects have conventionally occurred in the interface portions between the IMD layers in the BEOL adjacent to the conductive bumps in certain semiconductor chips. However, embodiments of the inventive concept provide semiconductor chips and semiconductor packages markedly less susceptible to CPT defects generated in relation to IMD layers in the BEOL.

Figure 2:
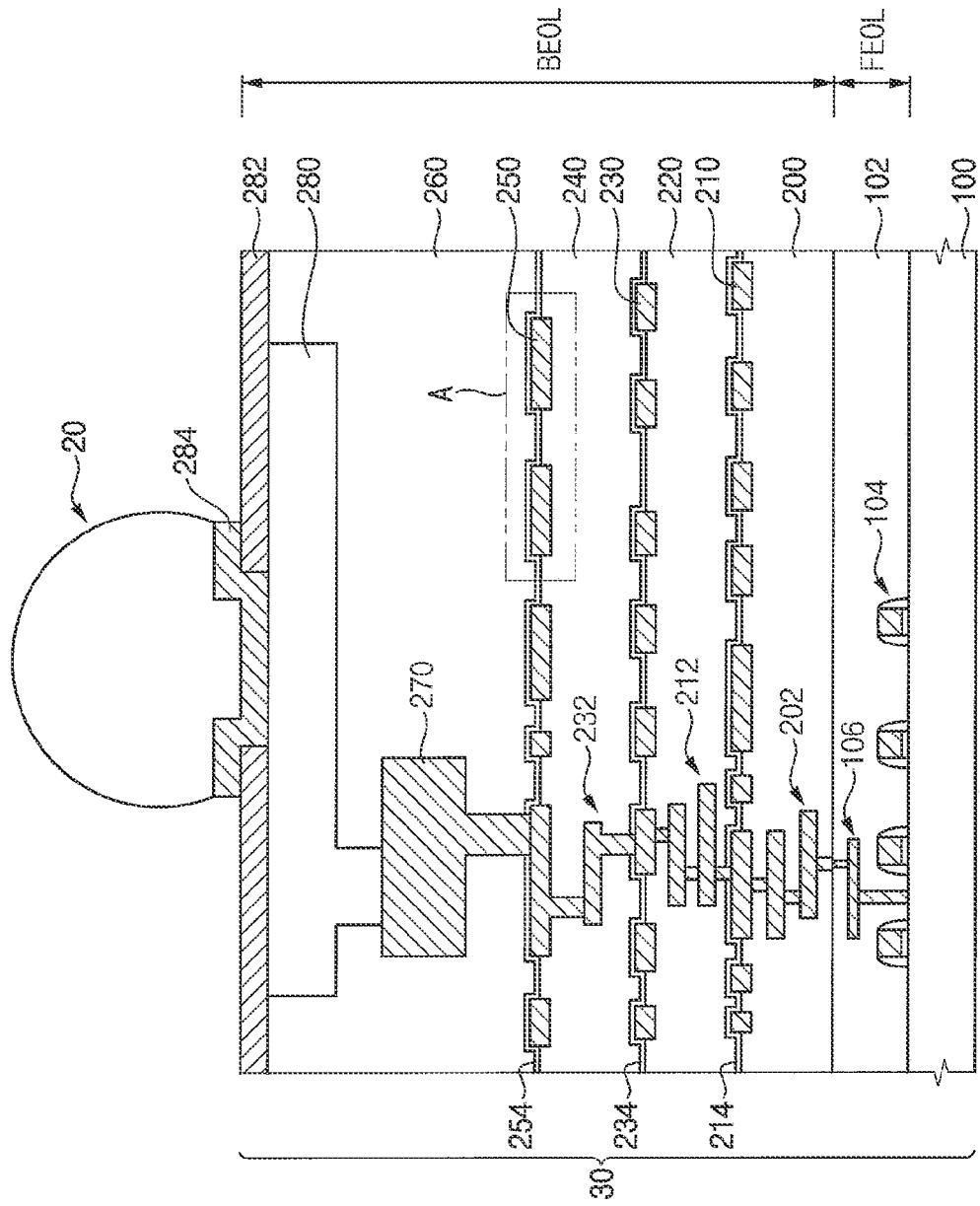
Figure 3:
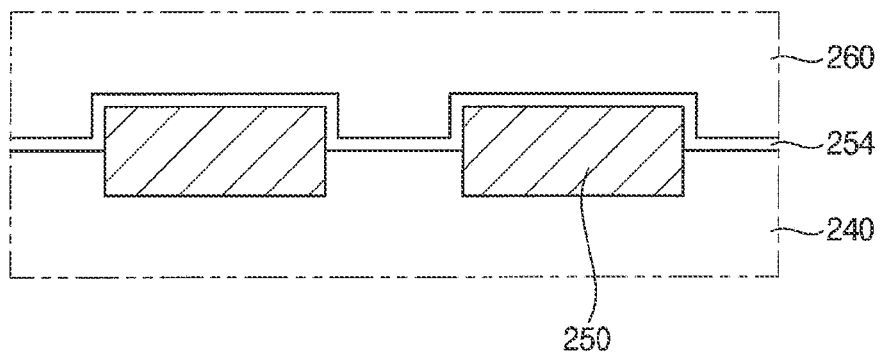

FIG. 2 is a cross-sectional view illustrating the semiconductor chip 30 according to embodiments of the inventive concept, and FIG. 3 is an enlarged view of portion 'A' shown in FIG. 2.

Referring to FIG. 2, the semiconductor chip 30 includes a FEOL and a BEOL formed on a silicon substrate 100. Here, the silicon substrate 100 may be variously positioned in relation to upper and lower portions of the semiconductor chip 30.

The FEOL may include various circuits depending on the nature, configuration and operation of the semiconductor chip 30 (e.g., a memory device and/or a logic device). In the illustrated example of FIG. 2, the FEOL is assumed to include transistors 104, a lower wiring 106, and a lower insulating interlayer 102 formed on the silicon substrate 100. In some embodiments, the FEOL may also include a capacitor.

The BEOL may be disposed on an upper surface of the FEOL and include a multilayer arrangement of metal wirings and IMD layers.

As the BEOL includes multiple metal wirings, each having relatively low resistance, the IMD layers may include material(s) having a dielectric constant less than 4 in order to reduced parasitic capacitance between the metal wirings. For example, the IMD layers may include stacked insulation material layers having different dielectric constants.

Hereinafter, an exemplary IMD layer having a stacked structure will be assumed to include a first IMD layer 200, a second IMD layer 220, a third IMD layer 240, and an uppermost insulation layer 260. However, the number and arrangement of stacked forming a IMD layer is a matter of design choice.

In the IMD layer, adjacent layers among the first, second and third IMD layers 200, 220 and 240, as well as the uppermost insulation layer 260 may have different dielectric constants. In addition, the adjacent layers among the first, second and third IMD layers 200, 220 and 240, as well as the uppermost insulation layer 260 may have different CTEs.

For example, in some embodiments, the first IMD layer 200 and the third IMD layer 240 may include a first low dielectric (low-k) material having a first dielectric constant. The first low-k material may have a first CTE. The second IMD layer 220 may include a second low dielectric (low-k) material having a second dielectric constant less than the first dielectric constant. The second low-k material may have a second CTE different from the first CTE. In this manner, the IMD layer may alternately stack the first low-k material and the second low-k material. The uppermost insulation layer 260 may have a dielectric constant different from the dielectric constant of the third IMD layer 240, and may have a CTE different from the CTE of the third IMD layer 240. The uppermost insulation layer 260 may include silicon oxide having a dielectric constant that ranges from about 3.9 to about 4.1, and may include (e.g.,) a TEOS (Tetraethyl orthosilicate) material.

For example, the first dielectric material may include a low-k material having a dielectric constant that ranges from between about 2.7 to about 3.9. The second dielectric material may include an ultra low-k material having a dielectric constant less than about 2.7. In this case, the CTE of the first IMD layer 200 and the third IMD layer 240 may be about 12 ppm, and the CTE of the second IMD layer 220 may be about 14 ppm. In addition, the CTE of the uppermost insulation layer 260 may be about 1.5 ppm. As such, the adjacent layer among the first to third IMD layers 200, 220, and 240 and the uppermost insulation layer 260 may have different CTEs.

A first metal wiring 202 may be formed in the first IMD layer 200, a second metal wiring 212 may be formed in the second IMD layer 220, and the third metal wiring 232 may be formed in the third IMD layer 240. An upper wiring 270 and a metal pad 280 may be formed in the uppermost insulation layer 260, but at least an upper surface of the metal pad 280 may be exposed through the uppermost insulation layer 260.

The first metal wiring 202, the second metal wiring 212, the third metal wiring 232, and the upper wiring 270 may include (e.g.,) copper, and the metal pad 280 may include (e.g.,) aluminum.

A passivation layer 282 may cover the uppermost insulation layer 260 and the upper surface of the metal pad 280. However, the passivation layer 282 may include an opening exposing at least a portion of the metal pad 280. A bump pad 284 may be conformally formed on an upper surface of the passivation layer 282 adjacent to the opening, a sidewall of the opening, and an upper surface of the metal pad 280 exposed by the opening.

A conductive bump 20 may be formed on the bump pad 284. The conductive bump 20 may cover an upper surface of the bump pad 284. Thus, a size of the bump pad 284 may be substantially the same as a size of the conductive bump 20.

The first metal wiring 202 may include a first via contact and a first metal pattern. The first via contact and the first metal pattern may be stacked in one layer or in a plurality of layers. An uppermost first metal pattern may be disposed at an uppermost portion of the first metal wiring 202, and the uppermost first metal pattern may be referred to as a first upper metal pattern 210.

The second metal wiring 212 may include a second via contact and a second metal pattern. The second via contact and the second metal pattern may be stacked in one layer or a plurality of layers. An uppermost second metal patterns may be disposed at an uppermost portion of the second metal wiring 212, and the uppermost second metal pattern may be referred to as a second upper metal pattern 230.

The third metal wiring 232 may include a third via contact and a third metal pattern. The third via contact and the third metal pattern may be stacked in one layer or a plurality of layers. An uppermost third metal patterns may be disposed on an uppermost portion of the third metal wiring 232, and the uppermost third metal pattern may be referred to as a third upper metal pattern 250.

As more particularly illustrated in FIG. 3, a lower surface of the uppermost insulation layer 260 and an upper surface of the third IMD layer 240 may come into contact in an area (e.g., an interface portion) between an upper surface and a lower surface of the third upper metal pattern 250. This interface portion between the uppermost insulation layer 260 and the third IMD layer 240 may be disposed at a height proximate a sidewall of the third upper metal pattern 250. Hereinafter, the term "interface portion"—as between two adjacent layers (e.g., an upper layer and a lower layer)—includes a lower surface of the upper layer, an upper surface of the lower layer and a portion between the upper layer and the lower layer. Thus, an "interface portion" comprises an area of contact between adjacent upper and lower layers and includes at least the lower surface of the upper layer and the upper surface of the lower layer.

The interface portion between the uppermost insulation layer 260 and the third IMD layer 240 may not be coplanar with each of upper and lower surfaces of the third upper metal pattern 250. Thus, the upper surface of the third upper metal pattern 250 may protrude upward from the upper surface of the third IMD layer 240.

In some embodiments, a third capping layer 254 may be conformally formed on the third IMD layer 240 and an upper surface of the third upper metal pattern 250. The third capping layer 254 may be interposed between the uppermost insulation layer 260 and the third IMD layer 240 and between the uppermost insulation layer 260 and the upper surface of the third upper metal pattern 530. The third capping layer 254 may be conformally formed on the surface of the third upper metal pattern 250 protruding from the upper surface of the third IMD layer 240, such that that the third capping layer 254 has an uneven shape. The third capping layer 254 may include (e.g.,) silicon nitride. The upper wiring 270 may pass through the third capping layer 254. Thus, the third capping layer 254 may not be formed in direct contact with a portion of the third upper metal pattern 250 and a portion of the upper wiring 270.

As the uppermost insulation layer 260 and the third IMD layer 240 may include materials having different dielectric constants and different CTEs, a high level of thermally-induced stress may be applied to the interface portion between the uppermost insulation layer 260 and the third IMD layer 240. In addition, a high level of thermally-inducted stress may be applied to the upper and lower surfaces of the third upper metal pattern 250. In particular, the stress may be concentrated at corner portions (or edge portions) of the upper and lower surfaces of the third upper metal pattern 250. However, as described above, the corner portions of the upper and lower surfaces of the third upper metal pattern 250 and the interface portion between the uppermost insulation layer 260 and the third IMD layer 240 are spaced apart from each other in a vertical direction. Further, the corner portions of the upper and lower surfaces of the third upper metal pattern 250 and the interface portions between the uppermost insulation layer 260 and the third MD layer 240 may not be coplanar with each other. Thus, the stress may be effectively dispersed, such that high concentrations of the stress are reduced. As a result, a bonding force between the uppermost insulation layer 260 and the third IMD layer 240 may be increased, and delamination and/or cracking at the interface portion between the uppermost insulation layer 260 and the third IMD layer 240 may be reduced.

As described above, the thermally-inducted stress may be highly generated around the conductive bump 20. Accordingly, the interface portion between the uppermost insulation layer 260 and the third IMD layer 240 proximate to the conductive bump 20 may vertically displaced to a height between the upper and lower surfaces of the third upper metal pattern 250 (e.g., at a plane level corresponding to a portion between the upper and lower surfaces of the third upper metal pattern 250).

In some embodiments, interface portions between the first to third IMD layers 200, 220 and 240 and the first and second upper metal patterns 210 and 230 disposed below the third IMD layer 240 may be disposed in a similar manner as described above.

In some embodiments, an interface portion between the third IMD layer 240 and the second IMD layer 220 may be positioned at a height of a portion between upper and lower surfaces of the second upper metal pattern 230. That is, the interface portion between the third IMD layer 240 and the second IMD layer 220 may not be coplanar with each of the upper and lower surfaces of the second upper metal pattern 230. The upper surface of the second upper metal pattern 230 may protrude from the upper surface of the second IMD layer 220. Thus, delamination and/or cracking at the interface portion between the third MD layer 240 and the second IMD layer 220 may be reduced.

In some embodiments, an interface portion between the second IMD layer 220 and the first IMD layer 200 may be positioned at a height of a portion between upper and lower surfaces of the first upper metal pattern 210. That is, the interface portion between the second IMD layer 220 and the first MD layer 200 may not be coplanar with each of the upper and lower surfaces of the first upper metal pattern 210. The upper surface of the first upper metal pattern 210 may protrude from the upper surface of the first IMD layer 200. Thus, delamination and/or cracking at the interface portion between second IMD layer 220 and the first IMD layer 200 may be reduced.

In some embodiments, a second capping layer may be conformally formed on the second IMD layer 220 and an upper surface of the second upper metal pattern 230. The second capping layer may be interposed between the third MD layer 240 and the second IMD layer 220 and between the third IMD layer 240 and the upper surface of the second upper metal pattern 230. In addition, a first capping layer 214 may be conformally formed on the first IMD layer 200 and an upper surface of the first upper metal pattern 210. The first capping layer 214 may be interposed between the second IMD layer 220 and the first IMD layer 200 and between the second IMD layer 220 and the upper surface of the first upper metal pattern 210. Each of the first and second capping layers 214 and 234 may have an uneven shape. Here, one or both of the first and second capping layers 214 and 234 may include (e.g.,) silicon nitride.

Figure 4:
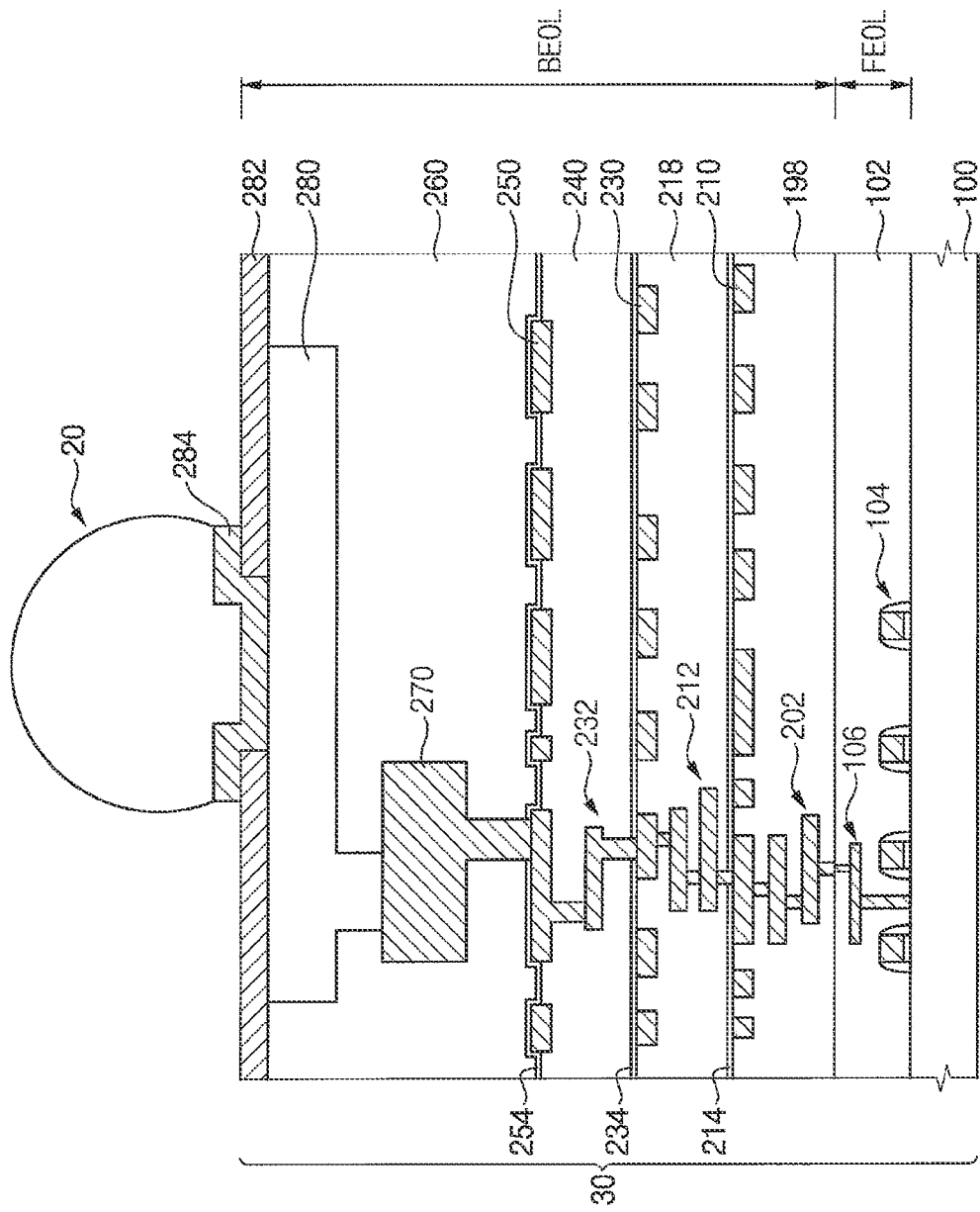

FIG. 4 is a cross-sectional view illustrating a semiconductor chip in accordance with embodiments of the inventive concept.

Referring to FIG. 4, in the semiconductor chip 30, an interface portion between the uppermost insulation layer 260 and the third IMD layer 240 disposed under the conductive bump 20 may be positioned at a height of a portion between upper and lower surfaces of the third upper metal pattern 250. Thus, the third capping layer 254 between the uppermost insulation layer 260 and the third IMD layer 240 and the third capping layer 254 on an upper surface of the third upper metal pattern 250 may not be same plane. The third capping layer 254 may have an uneven shape.

However, interface portions between the first, second and third IMD layers 198, 218 and 240 and upper surfaces of the first and second upper metal patterns 210 and 230 may be disposed below the third IMD layer 240 to be coplanar with each other. In this case, the first and second capping layers 214 and 234 may have a flat shape.

In some embodiments, an upper surface of the second IMD layer 218 may be coplanar with the upper surface of the second upper metal pattern 230.

In some embodiments, an upper surface of the first IMD layer 198 may be coplanar with the upper surface of the first upper metal pattern 210.

Alternately, the interface portion between the third IMD layer and the second IMD layer may be positioned at a height of a portion between the upper surface and the lower surface of the second upper metal pattern. Also, an upper surface of the first IMD layer under the second IMD layer may be coplanar with the upper surface of the first upper metal pattern.

In this manner, the interface portion between the IMD layers vertically adjacent to the conductive bump 20—at which a high concentration of thermally-induced stress is likely to be applied—may be positioned at only a height of a portion between the upper and lower surfaces of the upper metal pattern. Thus, a bonding force between the IMD layers may be increased, and stress may be dispersed. As a result, CPI defects, such as delamination and/or cracking of the IMD layers, may be reduced.

As described above, configurations in which the interface portion of the IMD layers are positioned at a height of the portion between the upper and lower surfaces of the upper metal pattern may be selectively applied to an entire region or a partial region of the semiconductor chip 30. Hereinafter, the making and use of embodiments of the inventive concept including this type of structure will be described in some additional detail.

In FIGS. 6, 7, 8, 9, 10, 11, 12, 13 and 14, an FEOL may include first, second and/or third capping layers formed on the silicon substrate. However, these material layers are omitted to reduce complexity in the drawings.

Figure 5:
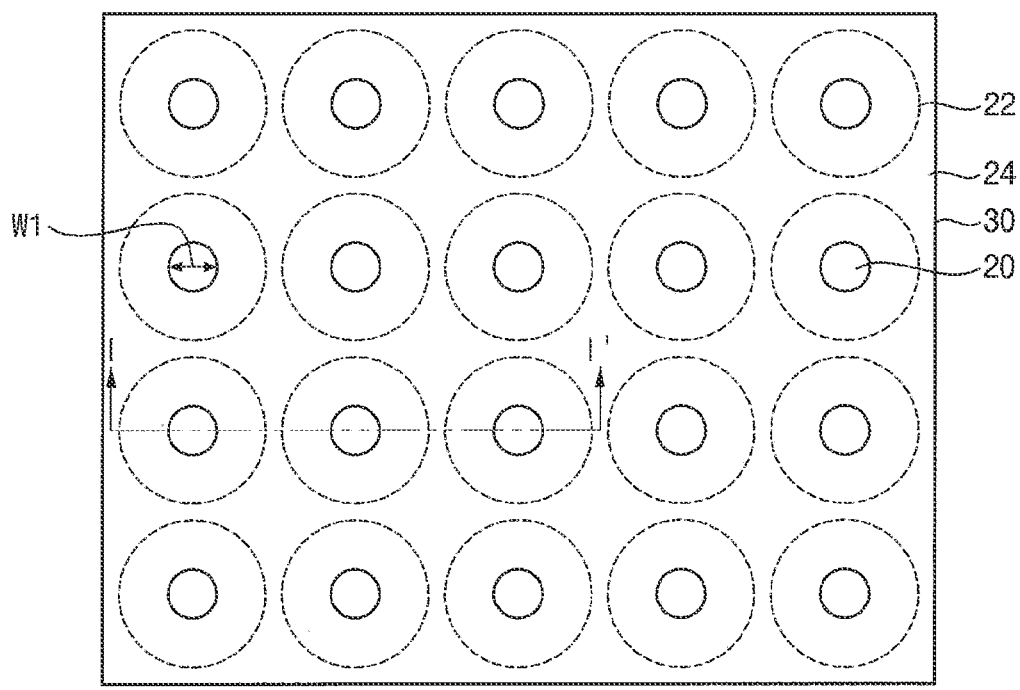
Figure 6:
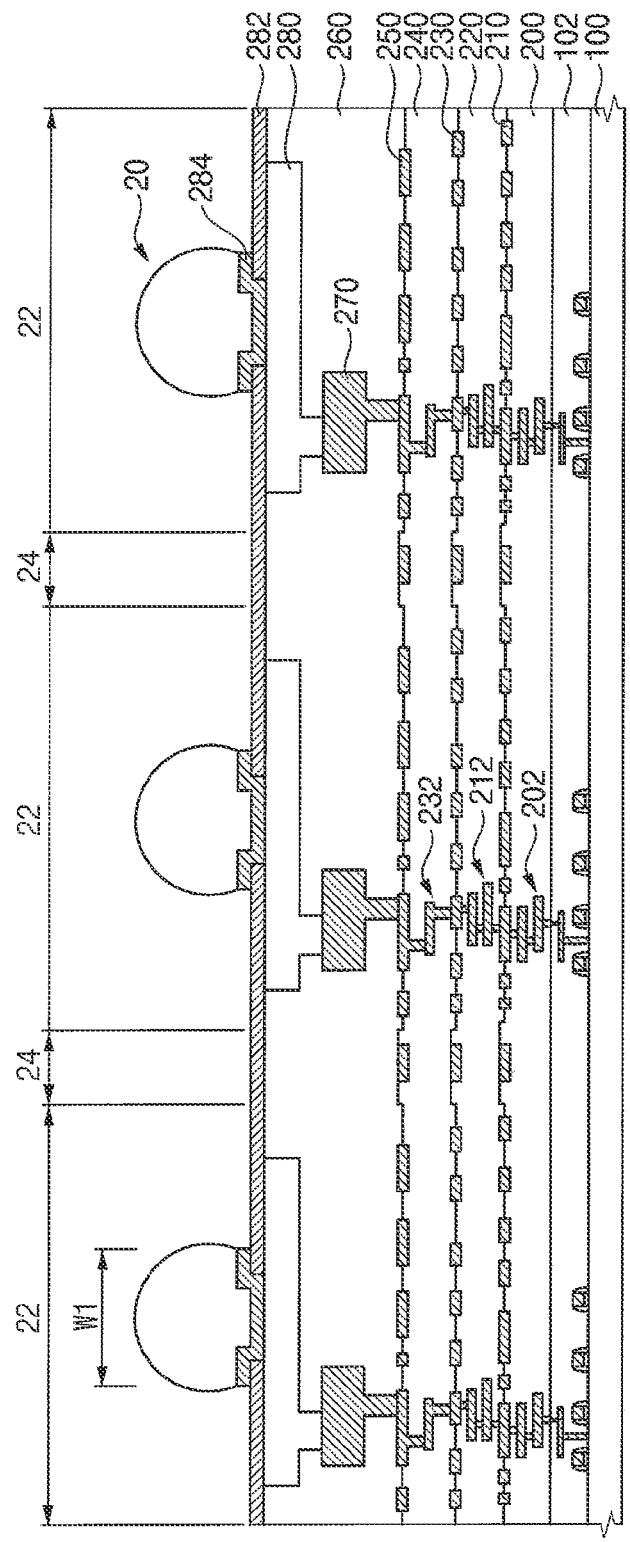

FIG. 5 is a plan (or top down) view and FIG. 6 is a cross-sectional view taken along line I-I' of FIG. 5 that collectively illustrate selected portions of the semiconductor chip 30 and a conductive bump according to embodiments of the inventive concept.

The semiconductor chip 30 may include a structure wherein an interface portion of the constituent IMD layers is positioned at a height of a portion between an upper surface and a lower surface of an upper metal pattern, as described in relation to FIG. 2. The structure may be applied to a region proximate to a bump pad (or a region within a certain range from sides of the bump pad).

Referring to FIGS. 5 and 6, a horizontal width of the bump pad 284 associated with the conductive bump 20 is assumed to have a first width W1. The interface portion of the IMD layers disposed in a first region 22 is positioned at a height of a portion between an upper surface and a lower surface of an upper metal pattern. The first region 22 may include a region of bump pad 284 and a region within a distance ranging from between about 0.5 times to about 1.2 times the first width W1 from the bump pad 284. Here, the first width W1 may be substantially similar to a diameter of the conductive bump 20.

That is, the BEOL in the first region 22 of semiconductor chip 30 of FIG. 6 may have a substantially similar structure to that previously described in relation to FIG. 2. In the BEOL in a second region 24 adjacent to the first region 22, an interface portion of the IMD layers may be coplanar with an upper surface of the upper metal pattern. And in the second region 24 proximate to the second region 22, an upper surface of the third IMD layer 240 and an upper surface of the third upper metal pattern 250 may be coplanar with each other. In the second region 24, an upper surface of the second IMD layer 220 may be coplanar with an upper surface of the second upper metal pattern 230. In the second region 22, an upper surface of the first IMD layer 200 may be coplanar with an upper surface of the first upper metal pattern 210.

In some embodiments, consistent with the description of FIG. 4, in the semiconductor chip 30, the interface portion between the uppermost insulation layer 260 and the third IMD layer 240 may be positioned at a height of a portion between the upper surface and the lower surface of the third upper metal pattern 250. An interface portion between the IMD layers under the third IMD layer 240 may be coplanar with an upper surface of the upper metal pattern. However, as described with reference to FIGS. 5 and 6, the structure may be applied to only the first region 22 including a region of the bump pad for forming the conductive bump 20 and a region within a defined distance range from the sides of the bump pad.

Figure 7:
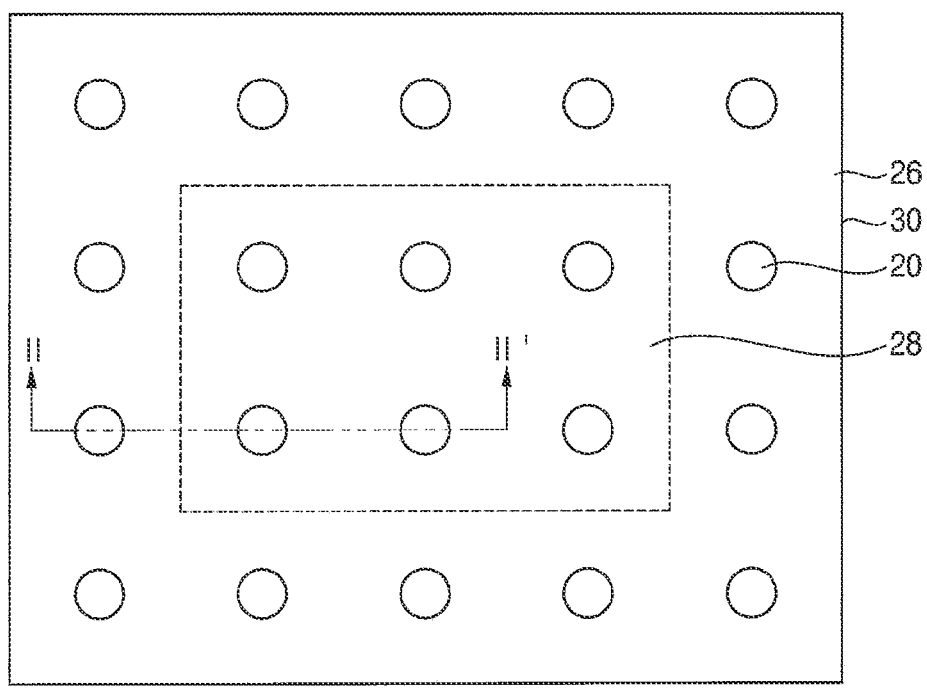
Figure 8:
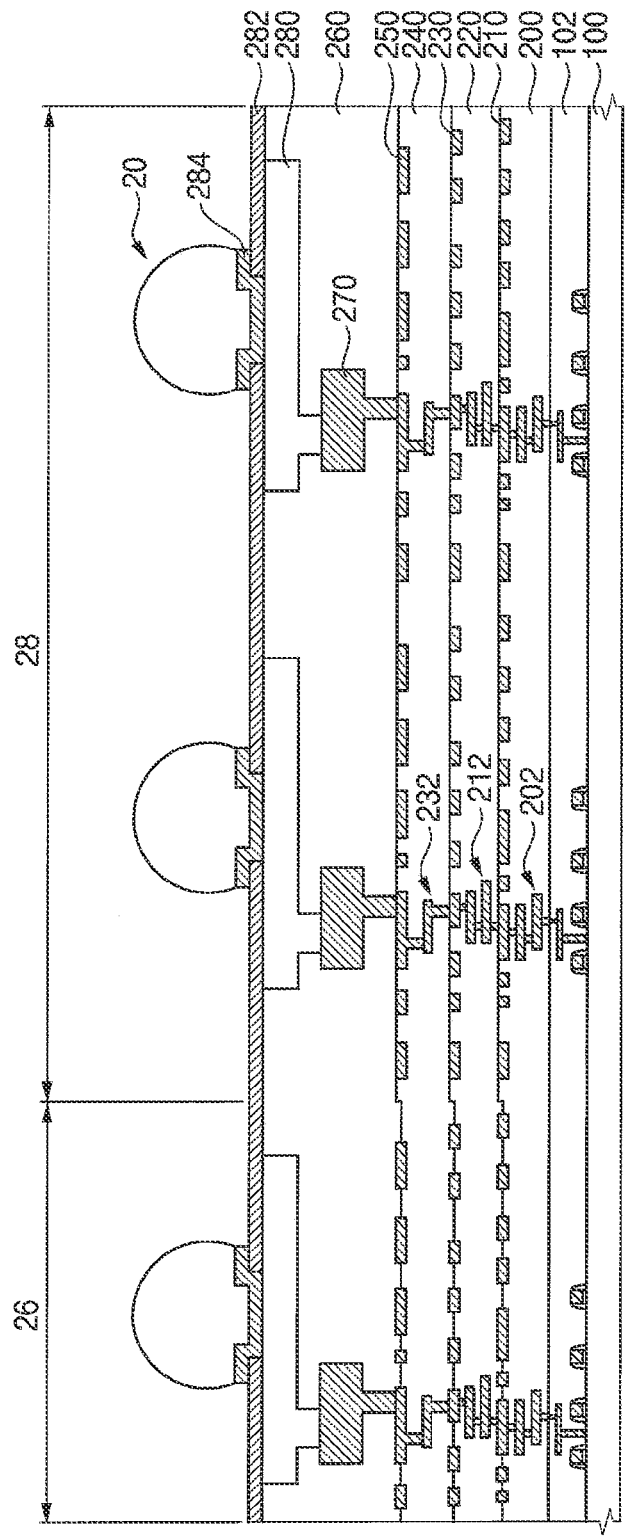

FIG. 7 is a plan view and FIG. 8 is a cross-sectional view taken along line II-II' of FIG. 7 that collectively illustrate selected portions of the semiconductor chip 30 and a conductive bump according to embodiments of the inventive concept.

Here, the semiconductor chip 30 may include a structure in which the interface portion of the IMD layers is positioned at the height of the portion between the upper surface and the lower surface of the upper metal pattern, as described in relation to FIG. 2. However, the structure may be applied to only an edge region 26 of the semiconductor chip 30.

Referring to FIGS. 7 and 8, in an edge region 26 of the semiconductor chip 30, the interface portion of the IMD layers may be positioned at the height of the portion between the upper and lower surfaces of the upper metal pattern. That is, the BEOL in the edge region 26 of the semiconductor chip 30 may have substantially the same structure as described in relation to FIG. 2.

At least one conductive bump 20 may be included in the edge region 26 of the semiconductor chip 30. As illustrated in FIG. 8, at least one bump pad 284 may be included in the edge region 26 of the semiconductor chip 30.

In contrast, in a more centrally disposed region 28, inwardly proximate to the edge region 26 of the semiconductor chip 30, the interface portion of the IMD layers may be coplanar with the upper surface of the upper metal pattern.

In some embodiments, as described in relation to FIG. 4, in the semiconductor chip 30, the interface portion between the uppermost insulation layer 260 and the third IMD layer 240 may be positioned at the height of the portion between the upper surface and the lower surface of the third upper metal pattern 250. The interface portion between the IMD layers under the third IMD layer 240 may be coplanar with the upper surface of the upper metal pattern. As described in relation to FIGS. 7 and 8, the foregoing structure may be applied to only the edge region 26 of the semiconductor chip 30.

Figure 9:
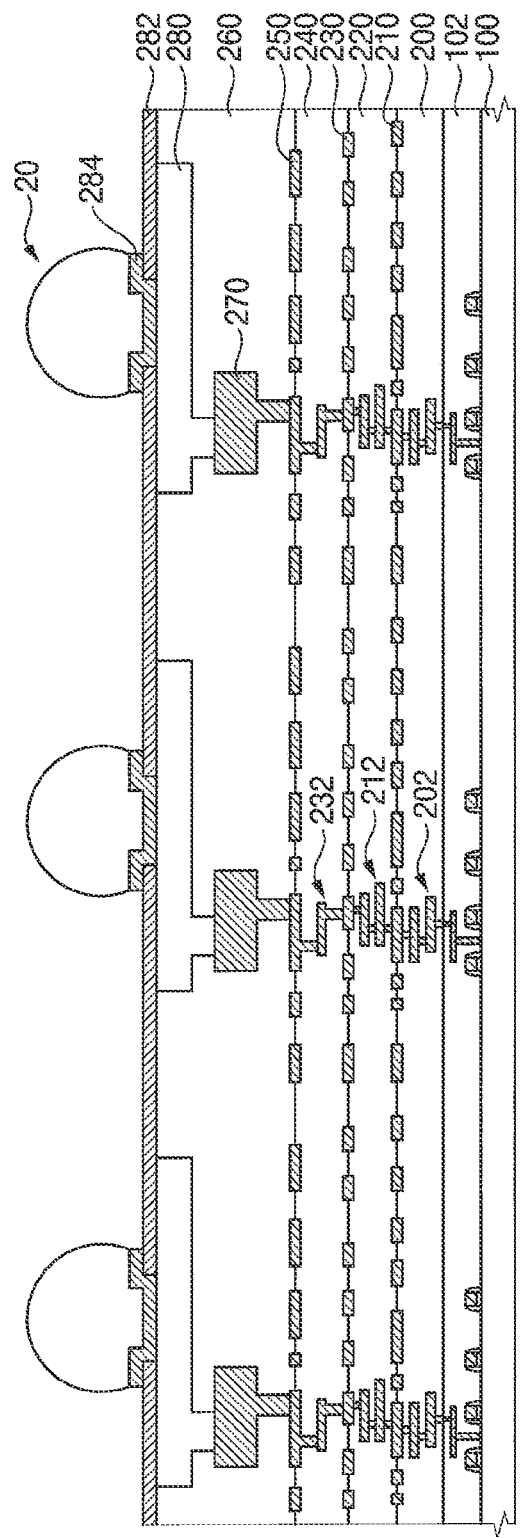

FIG. 9 is a cross-sectional view illustrating portions of the semiconductor chip 30 and a conductive bump according to embodiments of the inventive concept.

Here, the semiconductor chip 30 may include a structure in which the interface portion of the IMD layers is positioned at the height of the portion between the upper surface and the lower surface of the upper metal pattern, as described in relation to FIG. 2, however, the structure is applied to the entirety of the semiconductor chip 30.

Referring to FIG. 9, in the entirety of the semiconductor chip 30, the interface portion of the IMD layers may be positioned at the height of the portion between the upper and lower surfaces of the upper metal pattern.

Thus, in some embodiments like the one described in relation to FIG. 4, in the semiconductor chip 30, the interface portion between the uppermost insulation layer 260 and the third IMD layer 240 may be positioned at the height of the portion between the upper surface and the lower surface of the third upper metal pattern 250. The interface portion between the IMD layers under the third IMD layer 240 may be coplanar with the upper surface of the upper metal pattern. The structure may be applied to the entire region of the semiconductor chip 30.

FIGS. 10 to 16 are related cross-sectional views illustrating in one example a method of manufacturing a semiconductor chip and a conductive bump according to embodiments of the inventive concept. Hereinafter, the method of manufacturing will be described in the context of the semiconductor chip described in relation to FIGS. 5 and 6.

Figure 10:
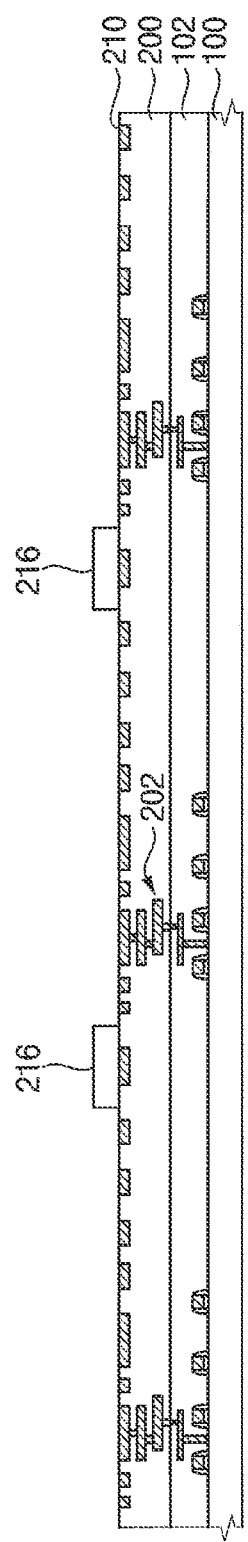
Figure 11:
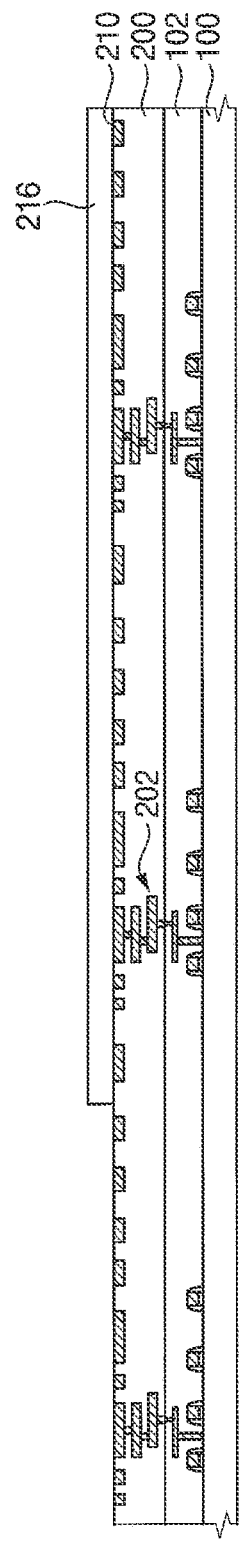

Referring to FIGS. 10 and 11, circuits constituting memory devices or logic devices may be formed on a silicon substrate 100, and a lower insulating interlayer 102 may be formed to cover the circuits.

A first IMD layer 200 and a first metal wiring 202 may be formed on the lower insulating interlayer 102. In embodiments, the first IMD layer 200 may include a first low dielectric material having a first dielectric constant.

The first metal wiring 202 may be formed by a damascene process. For example, the first IMD layer 200 may be formed, and trenches and/or via holes may be formed in the first IMD layer 200. A metal layer may be formed to fill the trench and/or the via hole, and the first metal wiring 202 may be formed by a planarization process of the metal layer.

The first metal wiring 202 may include a first via contact and a first metal pattern. The first via contact and the first metal pattern may be stacked in one layer or in a plurality of layers. An uppermost first metal patterns may be disposed at an uppermost portion of the first metal wiring 202, and the uppermost first metal pattern may be referred to as a first upper metal pattern 210.

An upper surface of the first IMD layer 200 and an upper surface of the first upper metal pattern 210 may be planarized, so that the upper surfaces of the first IMD layer 200 and the first upper metal pattern 210 may be coplanar with each other.

A first photoresist layer may be formed on the first IMD layer 200, and the first photoresist layer may be formed by exposure and development processes to form a first photoresist pattern 216.

The first photoresist pattern 216 may include an exposed portion, and the exposed portion may be positioned at a portion for reducing a height of an upper surface of the first IMD layer 200.

In some embodiments, as shown in FIG. 10, the first photoresist pattern 216 may be formed to expose a portion around the bump pad 284 for forming the conductive bump 20 in a subsequent process. For example, the first photoresist pattern 216 may expose a first region 22 (refer to FIG. 5) including a region of bump pad 284 and a region within a range of 0.5 times to 1.2 times of a first width from the bump pad 284. Thus, the first photoresist pattern 216 may cover a second region 24 (refer to FIG. 5) besides the first region 22.

In some embodiments, as illustrated in FIG. 11, the first photoresist pattern 216 may be formed to expose an edge region 26 (refer to FIG. 7) of the semiconductor chip 30. Thus, the first photoresist pattern 216 may cover other region 28 (refer to FIG. 7) besides the edge region 26 of the semiconductor chip 30. In this case, the semiconductor chip as shown in FIG. 8 may be manufactured by subsequent processes.

In some embodiments, the process for forming the first photoresist pattern 216 may not be performed. In this case, the semiconductor chip as shown in FIG. 9 may be manufactured by subsequent processes.

Figure 12:
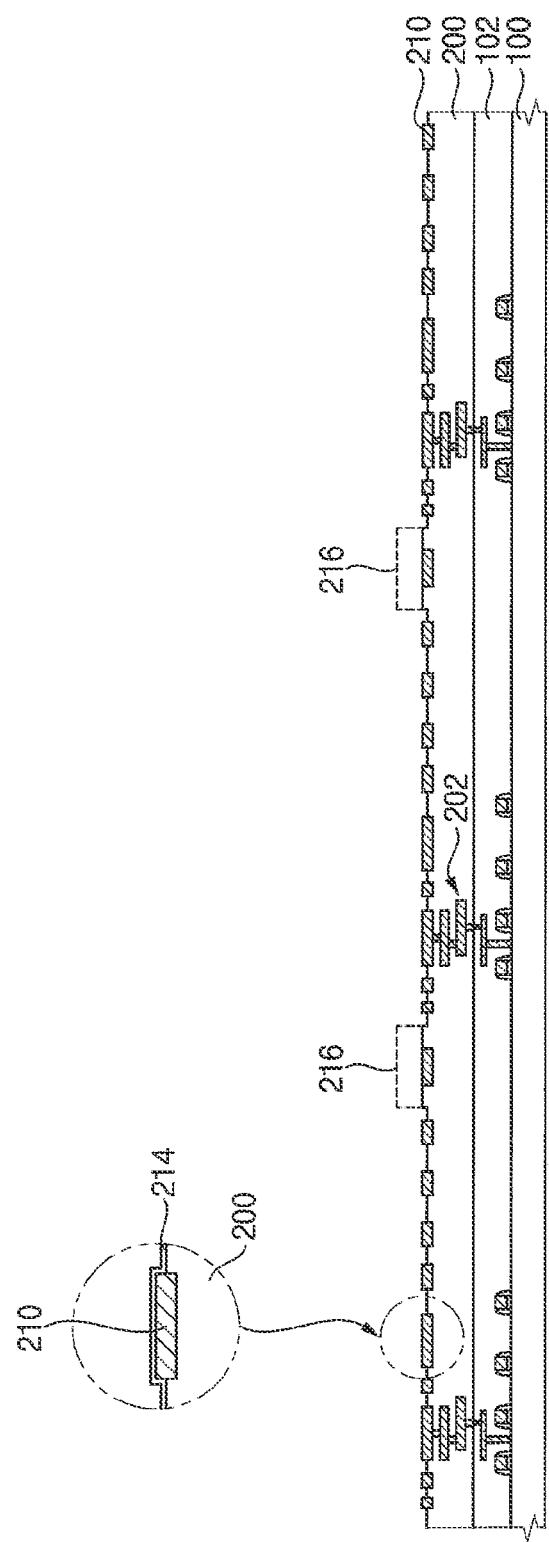

Referring to FIG. 12, an upper portion of the first IMD layer 200 may be etched using the first photoresist pattern 216 as an etching mask. The etching process may include, e.g., a wet etching process.

By the etching process, an upper surface of an etched portion of the first IMD layer 200 may be positioned at a height of a portion between the upper surface and a lower surface of the first upper metal pattern 210. The upper surface of the first IMD layer 200 may not be positioned at the same plane as each of the upper and lower surfaces of the first upper metal pattern 210. An upper portion of the first IMD layer 200 may be positioned at a height of a sidewall of the first upper metal pattern 210. That is, the upper surface of the first IMD layer 200 exposed by the first photoresist pattern 216 may be positioned at the height of the portion between the upper surface and the lower surface of the first upper metal pattern 210.

The first IMD layer 200 covered with the first photoresist pattern 216 may not be etched, so that an upper surface of an unetched portion of the first IMD layer 200 may be coplanar with the upper surface of the first upper metal pattern 210.

Thereafter, as shown in an enlarged drawing, a first capping layer 214 may be conformally formed on the surfaces of the first IMD layer 200 and the first upper metal pattern 210.

Figure 13:
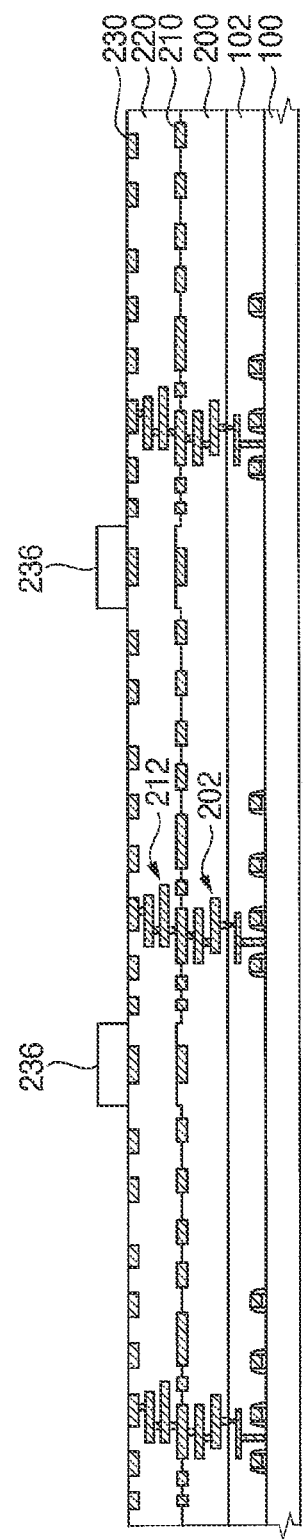

Referring to FIG. 13, a second IMD layer 220 and a second metal wiring 212 may be formed on the first IMD layer 200 and the first upper metal pattern 210. In embodiments, the second IMD layer 220 may include a second low dielectric material having a second dielectric constant different from the first dielectric constant.

The second metal wiring 212 may be formed by a damascene process. The second metal wiring 212 may include a second via contact and a second metal pattern. The second via contact and the second metal pattern may be stacked in one layer or in a plurality of layers. An uppermost second metal pattern may be disposed at an uppermost portion of the second metal wiring, and the uppermost second metal pattern may be referred to as a second upper metal pattern 230. Upper surfaces of the second IMD layer 220 and the second upper metal pattern 230 may be coplanar with each other.

A second photoresist layer may be formed on the second IMD layer 220, and the second photoresist layer may be patterned by exposure and development processes to form a second photoresist pattern 236.

The second photoresist pattern 236 may include an exposed portion, and the exposed portion may be positioned at a portion for reducing a height of an upper surface of the second IMD layer 220.

In some embodiments, as shown in FIG. 13, the second photoresist pattern 236 may be formed to expose the first region 22 around the bump pad 284 for forming the conductive bump 20 in a subsequent process.

In some embodiments, the second photoresist pattern 236 may be formed to expose the edge region 26 (refer to FIG. 7) of the semiconductor chip 30.

In some embodiments, the process of forming the second photoresist pattern 236 may not be performed.

Figure 14:
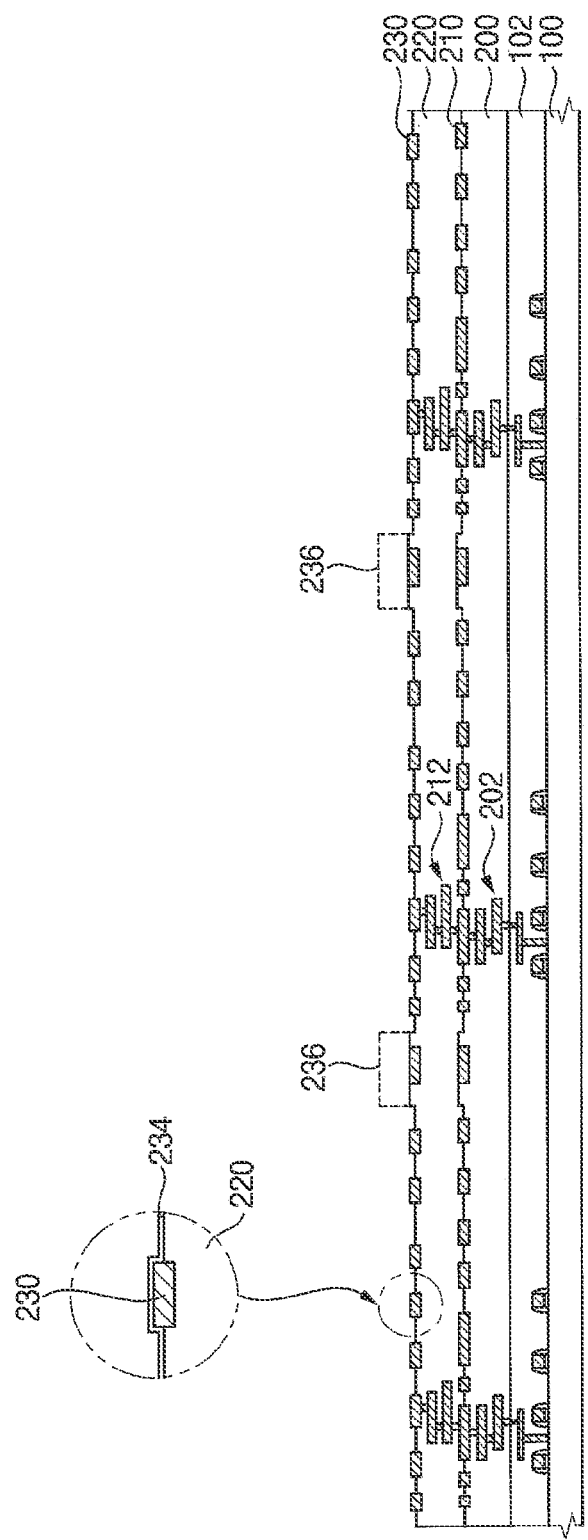

Referring to FIG. 14, an upper portion of the second IMD layer 220 may be etched using the second photoresist pattern 236 as an etching mask. The etching process may include, e.g., a wet etching process.

By the etching process, an upper surface of an etched portion of the second IMD layer 220 may be positioned at a height of a portion between upper and lower surfaces of the second upper metal pattern 230. The upper surface of the second IMD layer 220 may not be positioned at the same plane as each of upper and lower surfaces of the second upper metal pattern 230.

That is, the upper surface of the second IMD layer 220 exposed by the second photoresist pattern 236 may be positioned at the height of the portion between the upper and lower surfaces of the second upper metal pattern 230.

The second IMD layer 220 covered with the second photoresist pattern 236 may not be etched, so that an upper surface of an unetched portion of the second IMD layer 220 may be coplanar with the upper surface of the second upper metal pattern 230.

Thereafter, as shown in the enlarged drawing, a second capping layer 234 may be conformally formed on the surfaces of the second IMD layer 220 and the second upper metal pattern 230.

Figure 15:
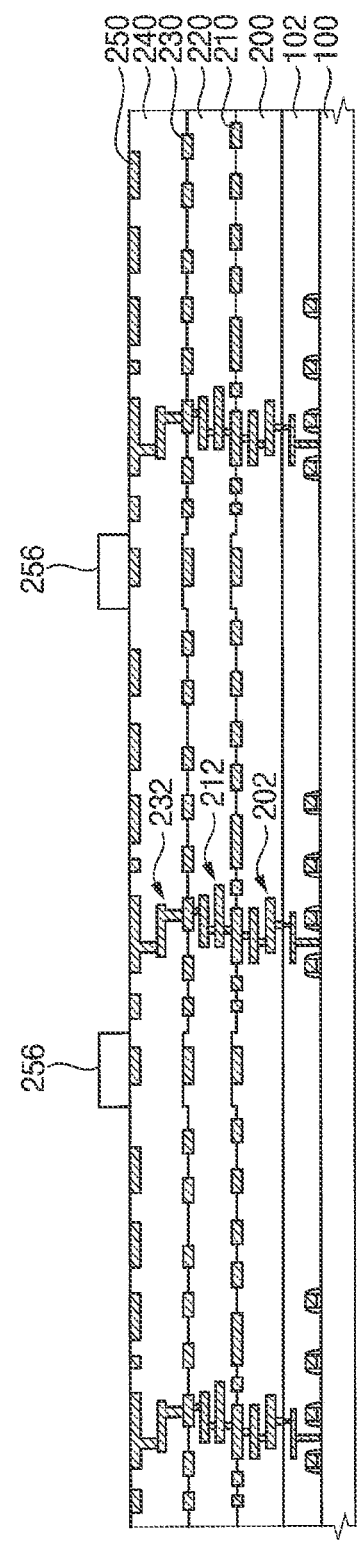

Referring to FIG. 15, a third IMD layer 240 and a third metal wiring 232 may be formed on the second IMD layer 220 and the second upper metal pattern 230. In embodiments, the third IMD layer 240 may include a material having a dielectric constant different from the second dielectric constant. For example, the third IMD layer 240 may include a material having the first dielectric constant.

The third metal wiring 232 may be formed by a damascene process. The third metal wiring 232 may include a third via contact and a third metal pattern. The third via contact and the third metal pattern may be stacked in one layer or a plurality of layers. An uppermost third metal pattern may be disposed at an uppermost portion of the third metal wiring 232, and the uppermost metal pattern may be referred to as a third upper metal pattern 250. Upper surface of the third IMD layer 240 and the third upper metal pattern 250 may be may be coplanar with each other.

A third photoresist layer may be formed on the third IMD layer 240, and the third photoresist layer may be patterned by exposure and development processes to form a third photoresist pattern 256.

The third photoresist pattern 256 may include an exposed portion, and the exposed portion may be positioned at a portion for reducing a height of an upper surface of the third IMD layer 240.

In some embodiments, as shown in FIG. 15, the third photoresist pattern 256 may be formed to expose the first region 22 (refer to FIG. 5) around the bump pad 284 for forming the conductive bump 20 in a subsequent process.

In some embodiments, the third photoresist pattern 256 may be formed to expose the edge region 26 (refer to FIG. 7) of the semiconductor chip 30.

In some embodiments, the process of forming the third photoresist pattern 256 may not be performed.

Figure 16:
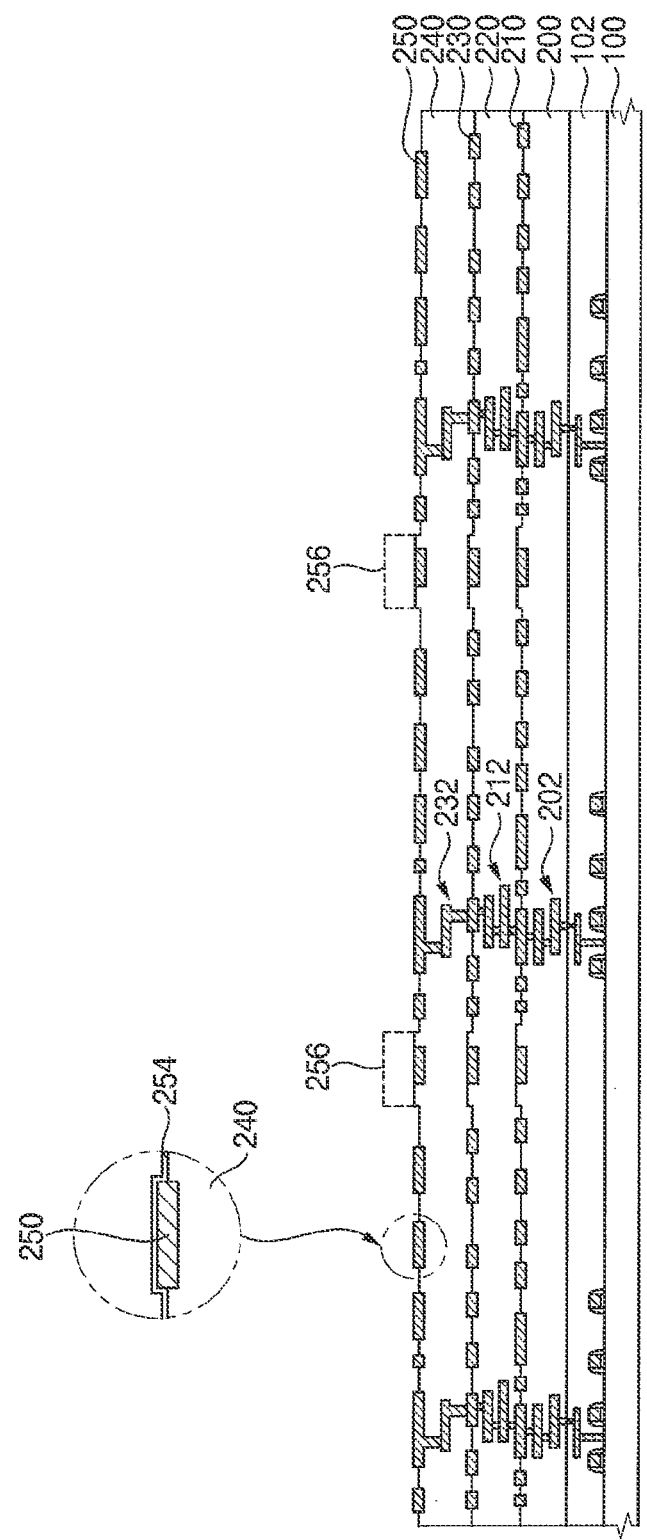

Referring to FIG. 16, an upper portion of the third IMD layer 240 may be etched using the third photoresist pattern 256 as an etching mask. The etching process may include, e.g., a wet etching process.

By the etching process, an upper surface of an etched portion of the third IMD layer 240 may be positioned at a height between upper and lower surfaces of the third upper metal pattern 250. The upper surface of the third IMD layer 240 may not be coplanar with each of upper and lower surfaces of the third upper metal pattern 250.

That is, the upper surface of the third IMD layer 240 exposed by the third photoresist pattern 256 may be positioned at the height of the portion between the upper and lower surfaces of the third upper metal pattern 250.

A portion of the third IMD layer 240 covered with the third photoresist pattern 256 may not be etched by the etching process. Thus, an upper surface of an unetched portion of the third IMD layer 240 may be coplanar with the upper surface of the third upper metal pattern 250.

Thereafter, as shown in an enlarged drawing, a third capping layer 254 may be conformally formed on the surfaces of the third IMD layer 240 and the third upper metal pattern 250.

Referring to FIG. 6 again, an uppermost insulation layer 260, an upper wiring 270, and a metal pad 280 may be formed on the third IMD layer 240 and the third upper metal pattern 250.

The uppermost insulation layer 260 may include an insulating material having a dielectric constant and a CTE different from those of the third IMD layer 240. The uppermost insulation layer 260 may include TEOS. An upper surface of the metal pad 280 may be coplanar with an upper surface of the uppermost insulation layer 260.

A passivation layer 282 may be formed on the uppermost insulation layer 260 and the metal pad 280. A portion of the passivation layer 282 may be removed to form an opening exposing the upper surface of the metal pad 280. A bump pad 284 may be conformally formed on a portion of the passivation layer 282, a sidewall of the opening, and an upper surface of the metal pad 280 exposed by the opening.

A conductive bump 20 may be formed on a bump pad 284.

By the above described method of manufacturing, the semiconductor chip 30 including the conductive bump 20 may be manufactured.

Figure 17:
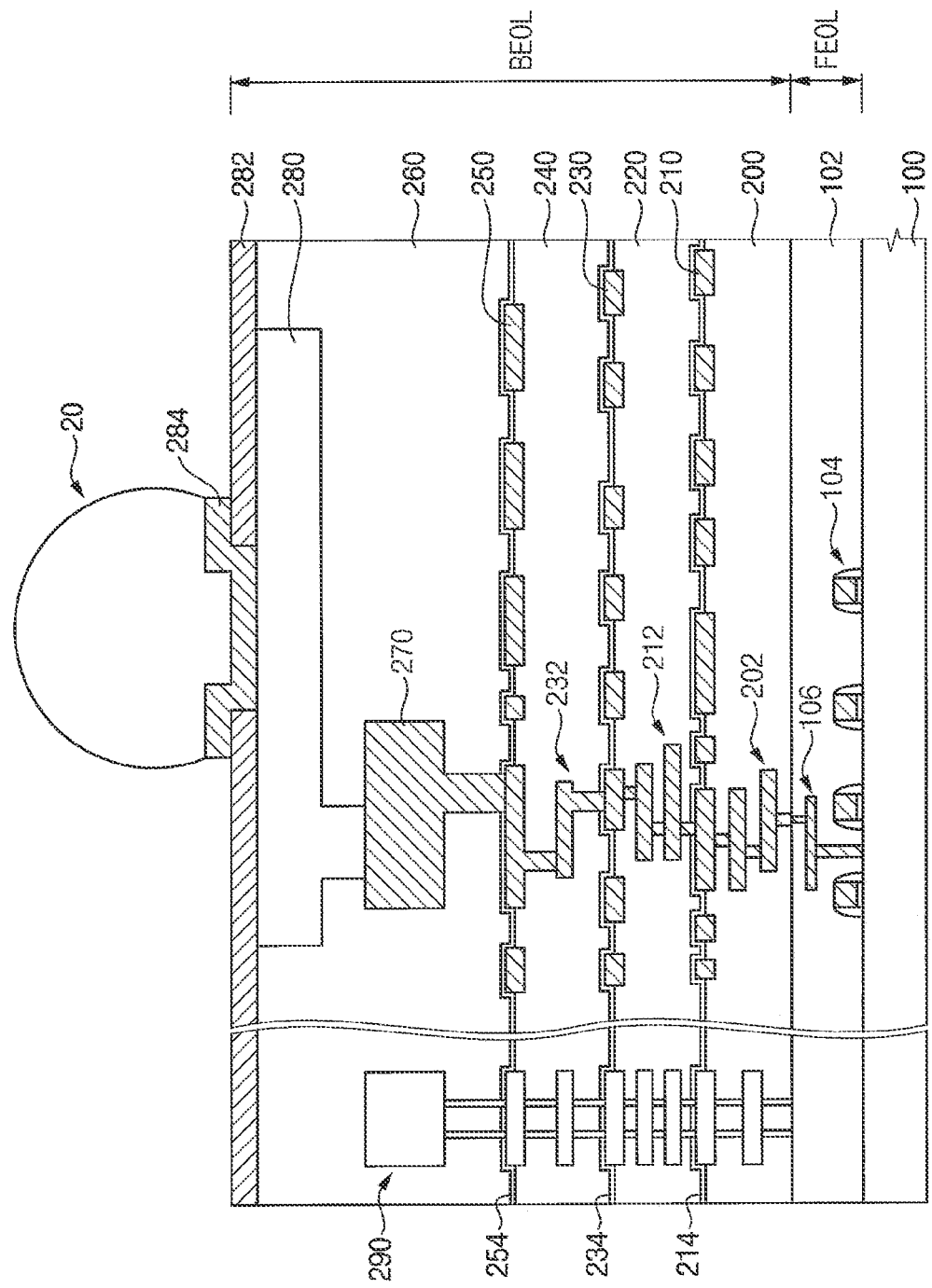

FIG. 17 is a cross-sectional view illustrating portions of a semiconductor chip and a conductive bump according to embodiments of the inventive concept.

The semiconductor chip has a structure characterized by an interface portion of the IMD layers disposed at a height of a portion between an upper surface and a lower surface of the upper metal pattern consistent with the embodiment described in relation to FIG. 2.

In addition, the semiconductor chip of FIG. 17 suppresses delamination and/or cracking in a scribe lane at an edge of the semiconductor chip.

Referring to FIG. 17, the IMD layer stacked structure including a plurality of IMD layers may be formed in the scribe lane, similar to the BEOL of the semiconductor chip 30. A crack prevention structure 290 may be formed in the IMD layer stacked structure in the scribe lane.

The semiconductor chips 30 may be singulated from the silicon substrate 100 by applying a sawing process to the scribe lane of the silicon substrate 100. As the scribe lane is sawed, cracking may be generated in the semiconductor chips 30. Hence, the crack prevention structure 290 may be formed in the scribe lane to suppress cracking in the semiconductor chip 30. Accordingly, the crack prevention structure 290 may be included at an edge of the individual semiconductor chip 30.

The crack prevention structure 290 may have a structure in which a plurality of metal wirings are stacked. In some embodiments, the crack prevention structure 290 may include via contacts and stacked metal patterns having a mesh structure. The via contacts and the metal patterns included in the crack prevention structure 290 may be positioned at the same level as the via contacts and the metal patterns included in the BEOL of the semiconductor chip 30, respectively.

In a scribe lane including the crack prevention structure 290, an interface portion of the IMD layers may be positioned at a height of a portion between the upper and lower surfaces of the upper metal pattern.

In some embodiments consistent with the embodiment of FIG. 17, the crack prevention structure 290 may include the first, second and third metal wirings 202, 212, and 232 along with the upper wiring 270 in the BEOL arranged in a mesh structure. In the scribe lane in which the crack prevention structure 290 is formed, an interface portion between the uppermost insulation layer 260 and the third IMD layer 240 may be positioned at a height of a portion between the upper and lower surfaces of the third upper metal pattern 250. In the scribe lane in which the crack prevention structure 290 is formed, an interface portion between the third IMD layer 240 and the second IMD layer 220 may be positioned at a height of a portion between the upper and lower surfaces of the second upper metal pattern 230. In the scribe lane in which the crack prevention structure 290 is formed, an interface portion between the second IMD layer 220 and the first IMD layer 200 may be positioned at a height of a portion between the upper and lower surfaces of the first upper metal pattern 210.

Thus, in the scribe lane in which the crack prevention structure 290 is formed, a delamination and/or cracking at an interface portion between the IMD layers may be reduced.

Figure 18:
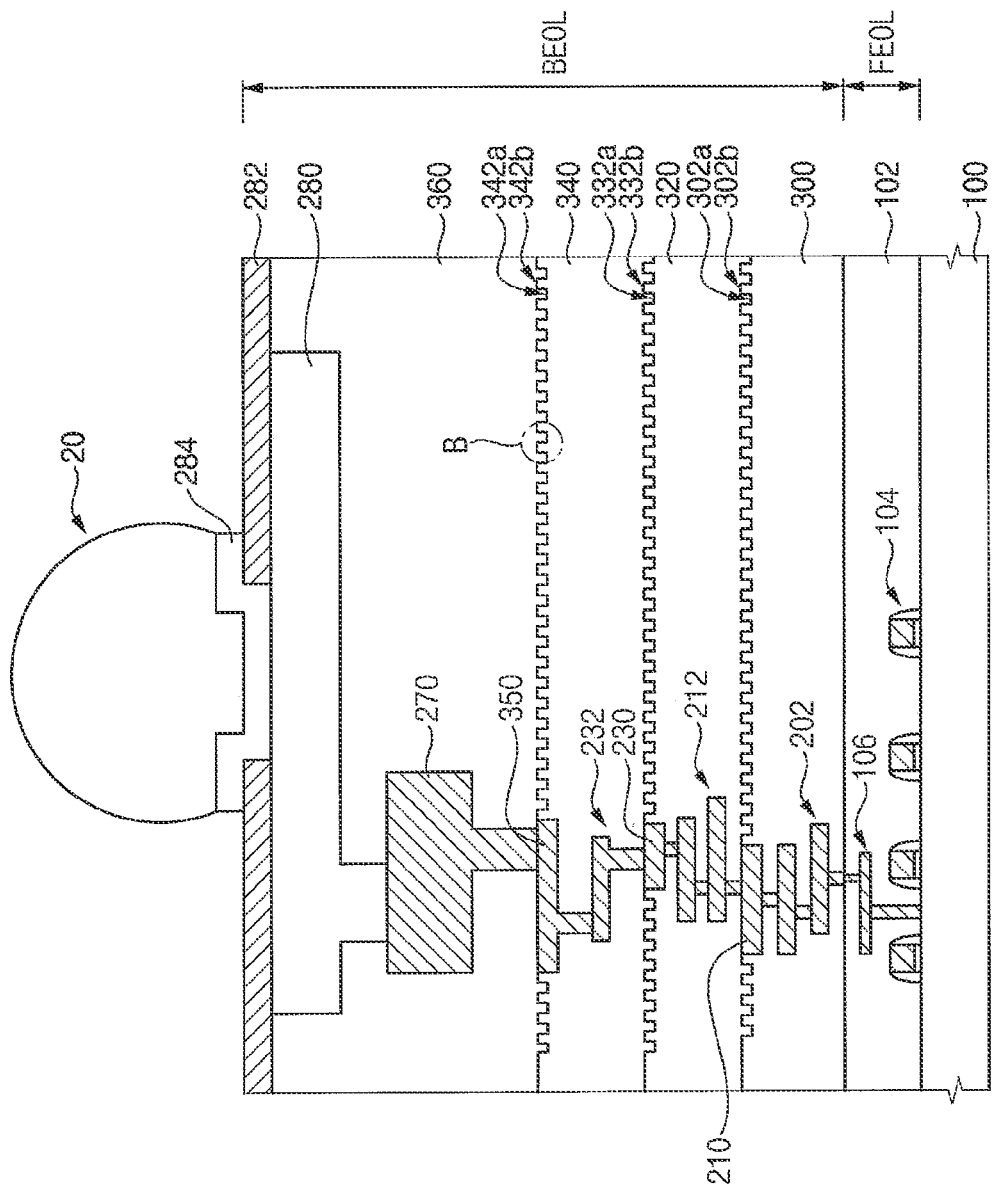
Figure 19:
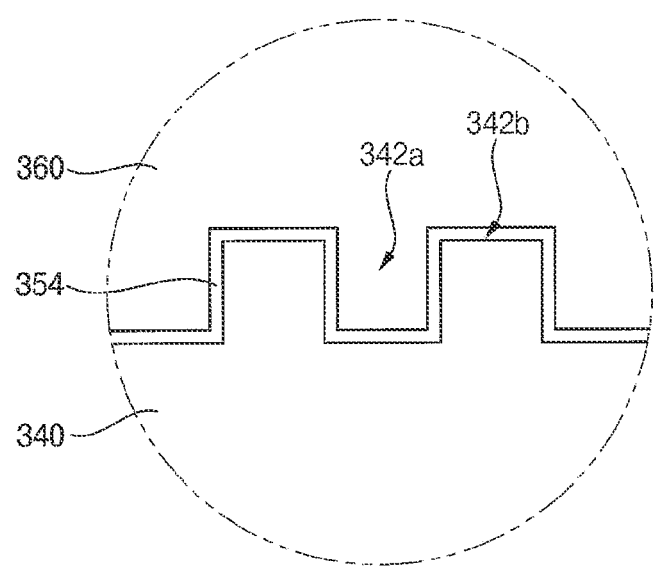

FIG. 18 is a cross-sectional view illustrating portions of a semiconductor chip and a conductive bump according to embodiments of the inventive concept, and FIG. 19 is an enlarged view of portion 'B' shown in FIG. 18.

The semiconductor chip and the conductive bump may be substantially similar to those described in relation to FIG. 2, except for a shape of an interface portion between IMD layers.

Referring to FIGS. 18 and 19, an interface portion between the uppermost insulation layer 360 and the third IMD layer 340 may include concave portions 342a and convex portions 342b.

The concave portions 342a and the convex portions 342b may be repeatedly and alternately disposed at an uppermost surface of the third IMD layer 340. In addition, the uppermost insulation layer 360 may cover the third IMD layer 340 to fill the concave portions 342a of the third IMD layer 340. The convex portions 342b of the third IMD layer 340 may be coplanar with an upper surface of a third upper metal pattern 350.

In embodiments, as shown in FIG. 19, a third capping layer 354 may be interposed between the uppermost insulation layer 360 and the third IMD layer 340. The third capping layer 354 may be conformally formed on the concave portions and the convex portions of the third IMD layer 340.

The uppermost insulation layer 360 may have a material having a dielectric constant and a CTE different from those of the third IMD layer 340. A stress may be highly applied to adjacent the uppermost insulation layer 360 and the third IMD layer 340. However, the interface portion between the uppermost insulation layer 360 and the third IMD layer 340 may have the concave portions and the convex portions, so that a contact area between the uppermost insulation layer 360 and the third IMD layer 340 may be increased. Thus, a bonding force between the uppermost insulation layer 360 and the third IMD layer 340 may be increased, such that delamination and/or cracking at the interface portion between the uppermost insulation layer 360 and the third IMD layer 340 may be reduced.

As described above, the stress may be highly generated at around the conductive bump 20. Thus, the interface portion between the uppermost insulation layer 360 and the third IMD layer 340 under the conductive bump 20 may have the concave portions and the convex portions.

In some embodiments, the concave portions and the convex portions may be further disposed at the interface portion of the IMD layers 300 and 320 under the third IMD layer 340.

In some embodiments, the concave portions 332a and the convex portions 332b may be included at an interface portion between the third IMD layer 340 and the second IMD layer 320. Thus, delamination and/or cracking at an interface portion between the third IMD layer 340 and the second IMD layer 320 may be reduced. A second capping layer may be conformally formed on the concave portions and the convex portions of an upper surface of the second IMD layer 320.

In some embodiments, the concave portions 302a and the convex portions 302b may be included at an interface portion between the second IMD layer 320 and the first IMD layer 300. Thus, delamination and/or cracking at an interface portion between the second IMD layer 320 and the first IMD layer 300 may be decreased. A first capping layer may be conformally formed on the concave portions and the convex portions of an upper surface of the first IMD layer 300.

In some embodiments, the semiconductor chip 30 may include a structure in which the concave portions and the convex portions are formed at an interface portion of the IMD layers, the same as illustrated with reference to FIG. 18, and the structure may be applied to the first region.

In some embodiments, the semiconductor chip 30 may include a structure in which the concave portions and the convex portions are formed at an interface portion of the IMD layers, the same as illustrated with reference to FIG. 18, and the structure may be only applied to the edge region of the semiconductor chip 30.

In some embodiments, the semiconductor chip 30 may include a structure in which the concave portions and the convex portions are formed at an interface portion of the IMD layers, the same as illustrated with reference to FIG. 18, and the structure may be applied to the entire region of the semiconductor chip 30.

The semiconductor chip and the conductive bump shown in FIG. 18 may be manufactured by processes similar to that illustrated with reference to FIGS. 10 to 16.

However, exposed portions of each of the first to third photoresist patterns may be different from those of the first to third photoresist patterns illustrated with reference to FIGS. 10 to 16. That is, the exposed portion of the first photoresist pattern may be positioned at a portion corresponding to the concave portion of the first IMD layer 200. The exposed portion of the second photoresist pattern may be positioned at a portion corresponding to the concave portion of the second IMD layer 220. The exposed portion of the third photoresist pattern may be positioned at a portion corresponding to the concave portion of the third IMD layer 240.

In embodiments, a bonding force between the IMD layers may be increased, and thermally-induced stress may be decreased at the interface portion between the IMD layers. Thus, CPI defects due to differences in rates of thermal expansion between the package substrate and the semiconductor chip may be reduced.

The foregoing embodiments ac illustrative of the inventive concept which should not be construed as being limited thereto. Although a few embodiments have been described, those skilled in the art will readily appreciate that many modifications are possible in the embodiments without materially departing from the novel teachings and advantages of the inventive concept. Accordingly, all such modifications are intended to be included within the scope of the present inventive concept as defined in the claims.

What is claimed is:

1. A semiconductor chip comprising:
   an intermetal dielectric (IMD) layer on a substrate;
   an uppermost insulation layer on the IMD layer, the uppermost insulation layer having a dielectric constant different from a dielectric constant of the IMD layer;
   a metal wiring in the IMD layer, the metal wiring including a via contact and a metal pattern;
   a metal pad in the uppermost insulation layer, the metal pad being electrically connected to the metal wiring; and
   a bump pad on the metal pad, wherein:
   at least a portion of the IMD layer extends to a height of an upper surface of the metal pattern,
   at least a portion of the uppermost insulation layer extends to a lower height than the upper surface of the metal pattern but not the lower surface of the metal pattern, and
   an interface portion between the uppermost insulation layer and the IMD layer is positioned at a level of a sidewall of the metal pattern.

2. The semiconductor chip of claim 1, wherein the upper surface of the metal pattern is exposed through an upper surface of the IMD layer.

3. The semiconductor chip of claim 1, wherein the IMD layer includes an oxide having a dielectric constant less than 4.

4. The semiconductor chip of claim 1, wherein the uppermost insulation layer includes an oxide having a dielectric constant greater than a dielectric constant of the IMD layer.

5. The semiconductor chip of claim 1, wherein the IMD layer has a coefficient of thermal expansion different from a coefficient of thermal expansion of the uppermost insulation layer.

6. The semiconductor chip of claim 1, further comprising a conductive bump on the bump pad.

7. The semiconductor chip of claim 1, further comprising:
   a first region in which the bump pad is formed, wherein a portion between the upper surface and the lower surface of the metal pattern in the IMD layer is disposed at a distance a ranging from about 0.5 times to about 1.2 times a width of the bump pad from the bump pad.

8. The semiconductor chip of claim 7, wherein the first region is an edge region of the substrate.

9. The semiconductor chip of claim 1, further comprising:
a capping layer conformally formed between the IMD layer and the uppermost insulation layer, wherein
an upper surface of the metal pattern is exposed through an upper surface of the IMD layer.

10. The semiconductor chip of claim 1, further comprising:
a stacked plurality of IMD layers disposed between the substrate and the IMD layer; and
a plurality of metal wirings in each one of the stacked plurality of IMD layers, wherein
adjacent IMD layers among the stacked plurality of IMD layers have different dielectric constants.

11. The semiconductor chip of claim 10, wherein an interface portion is disposed at a height between an upper surface and a lower surface of the metal pattern in an IMD layer among the plurality of IMD layers.

12. A semiconductor chip comprising:
a first intermetal dielectric (IMD) layer on a substrate, the first IMD layer having a first dielectric constant;
a second IMD layer on the first IMD layer, the second IMD layer having a second dielectric constant different from the first dielectric constant;
a third IMD layer on the second IMD layer, the third IMD layer having a third dielectric constant different from the second dielectric constant;
an uppermost insulation layer on the third IMD layer, the uppermost insulation layer having a fourth dielectric constant different from the third dielectric constant;
a first metal wiring in the first IMD layer, the first metal wiring including a first via contact and a first metal pattern;
a second metal wiring in the second IMD layer, the second metal wiring including a second via contact and a second metal pattern;
a third metal wiring in the third IMD layer, the third metal wiring including a third via contact and a third metal pattern;
a metal pad in the uppermost insulation layer, the metal pad being electrically connected to the third metal wiring; and
a bump pad for forming a conductive bump on the metal pad, wherein:
at least a portion of the third IMD layer extends to a height of an upper surface of the third metal pattern,
at least a portion of the uppermost insulation layer extends to a lower height than the upper surface of the third metal pattern but not the lower surface of the third metal pattern, and
an interface portion between the uppermost insulation layer and the third IMD layer is positioned at a level of a sidewall of the third metal pattern.

13. The semiconductor chip of claim 12, wherein:
in a first region, an upper surface of the second metal pattern disposed at an uppermost portion is exposed through an upper surface of the second IMD layer, and
in the first region, an upper surface of the first metal pattern disposed at an uppermost portion is exposed through an upper surface of the first IMD layer.

14. The semiconductor chip of claim 12, wherein:
the first dielectric constant, the second dielectric constant and the third dielectric constant are less than 4, and
the fourth dielectric constant is greater than the first dielectric constant, the second dielectric constant and the third dielectric constant.

15. The semiconductor chip of claim 12, wherein among in the first IMD layer, the second IMD layer, the third IMD layer and the uppermost insulation layer, adjacent layers have different coefficients of thermal expansion.

16. The semiconductor chip of claim 12, wherein a first region includes a region including the bump pad and a region within a distance ranging from between about 0.5 times to about 1.2 times a width of the bump pad from the bump pad.

17. The semiconductor chip of claim 12, wherein:
a first region is an edge region of the substrate, and
at least one bump pad is disposed in the edge region.

18. The semiconductor chip of claim 12, further comprising:
a first capping layer conformally formed on a portion between the first IMD layer and the second IMD layer and a surface of the first metal pattern;
a second capping layer conformally formed on a portion between the second IMD layer and the third IMD layer and a surface of the second metal pattern; and
a third capping layer conformally formed on a portion between the third IMD layer and the uppermost insulation layer and a surface of the third metal pattern protruding from an upper surface of the third IMD layer.

19. A semiconductor package comprising:
a package substrate;
a semiconductor chip; and
conductive bumps interposed between the package substrate and the semiconductor chip and electrically connecting the semiconductor chip and the package substrate, wherein:
the semiconductor chip includes:
an intermetal dielectric (IMD) layer on a substrate;
an uppermost insulation layer contacting an upper surface of the IMD layer, the uppermost insulation layer having a dielectric constant different from a dielectric constant of the IMD layer;
a metal wiring in the IMD layer, the metal wiring including a via contact and a metal pattern;
a metal pad in the uppermost insulation layer, the metal pad being electrically connected to the metal wiring; and
a bump pad on the metal pad,
at least a portion of the IMD layer extends to a height of an upper surface of the metal pattern,
at least a portion of the uppermost insulation layer extends to a lower height than the upper surface but not the lower surface of the metal pattern, and
an interface portion between the uppermost insulation layer and the IMD layer is positioned at a level of a sidewall of the metal pattern.

20. The semiconductor package of claim 19, wherein the IMD layer and the uppermost insulation layer in the semiconductor chip have different coefficients of thermal expansion.

* * * * *